United States Patent
Graber

(10) Patent No.: US 9,689,929 B2
(45) Date of Patent: Jun. 27, 2017

(54) TWO WIRE COMBINED POWER AND DATA NETWORK SYSTEM SEGMENT WITH FAULT PROTECTION DEVICE

(71) Applicant: Pepperl + Fuchs GmbH, Mannheim (DE)

(72) Inventor: Steffen Graber, Mannheim (DE)

(73) Assignee: Pepperl + Fuchs GmbH (DE)

( * ) Notice: Subject to any disclaimer, the term of this patent is extended or adjusted under 35 U.S.C. 154(b) by 209 days.

(21) Appl. No.: 14/399,389

(22) PCT Filed: May 22, 2013

(86) PCT No.: PCT/EP2013/060548
§ 371 (c)(1),
(2) Date: Nov. 6, 2014

(87) PCT Pub. No.: WO2013/174887
PCT Pub. Date: Nov. 28, 2013

(65) Prior Publication Data
US 2015/0097594 A1    Apr. 9, 2015

(30) Foreign Application Priority Data
May 23, 2012   (GB) .................................. 1209053.6

(51) Int. Cl.
*G01R 31/40*      (2014.01)
*G05B 9/02*      (2006.01)

(52) U.S. Cl.
CPC ............... *G01R 31/40* (2013.01); *G05B 9/02* (2013.01); *G05B 2219/24047* (2013.01); *G05B 2219/25132* (2013.01); *G05B 2219/25154* (2013.01)

(58) Field of Classification Search
CPC G01R 31/40; G05B 9/02; G05B 2219/24047; G05B 2219/25132; G05B 2219/25154

(Continued)

(56) References Cited

U.S. PATENT DOCUMENTS

| | | | | |
|---|---|---|---|---|
| 5,655,036 A | * | 8/1997 | Webb | H04B 10/07 385/15 |
| 8,963,574 B2 | * | 2/2015 | La Rosa | G06F 21/552 324/522 |

(Continued)

FOREIGN PATENT DOCUMENTS

| | | |
|---|---|---|
| DE | 4432237 A1 | 12/1995 |
| DE | 102005062873 A1 | 7/2007 |
| WO | 2011148127 A1 | 12/2011 |

OTHER PUBLICATIONS

International Search Report and Written Opinion for Application No. PCT/EP2013/060548 dated Jul. 16, 2013.

*Primary Examiner* — Son Le
*Assistant Examiner* — Akm Zakaria
(74) *Attorney, Agent, or Firm* — Lerner, David, Littenberg, Krumholz & Mentlik, LLP

(57) ABSTRACT

A segment of a two wire combined power and data network for automation has a trunk, a spur mounted thereon and a fault protection device. The fault protection device includes a controller adapted to monitor the spur current, and isolation means to fully or partially isolate the spur from the trunk upon receiving of an activation signal from controller. The controller comprises a failure status determination algorithm comprising an intermittent fault count over time step and a fault duration step. The intermittent fault count step is satisfied if a pre-determined number of separate faults are detected over a first time period. The fault duration step is satisfied if a fault is detected which persists for longer than a second time period. The controller issues the activation signal upon determination of a failure status on the spur which satisfies the intermittent fault count and/or the fault duration step of the algorithm.

17 Claims, 3 Drawing Sheets

(58) Field of Classification Search
USPC .................................................. 324/764.01
See application file for complete search history.

(56) References Cited

U.S. PATENT DOCUMENTS

| | | |
|---|---|---|
| 2005/0140460 A1 | 6/2005 | Poirier et al. |
| 2009/0215324 A1* | 8/2009 | Rogoll ............... G05B 19/0423 439/717 |
| 2010/0082197 A1* | 4/2010 | Kolbet ............... G05B 19/0428 701/31.4 |
| 2011/0279939 A1* | 11/2011 | Kitchener ................. H02J 1/10 361/87 |

* cited by examiner

TWO WIRE COMBINED POWER AND DATA NETWORK SYSTEM SEGMENT WITH FAULT PROTECTION DEVICE

The present invention relates to a segment of a two wire combined power and data network system, which comprises a fault protection device with an improved failure status detection algorithm, for use particularly, but not exclusively, as an IEC61158 Fieldbus network segment. The invention also includes such a fault protection device in isolation, as well as a method of using it.

BACKGROUND

Fieldbus is the name of a family of industrial computer network protocols used for real-time distributed control, now standardized as IEC61158. A complex automated industrial system, for example a fuel refinery, usually needs an organized hierarchy of controller systems to function. In this hierarchy there is a Human Machine Interface (HMI) at the top, where an operator can monitor or operate the system. This is typically linked to a middle layer of programmable logic controllers (PLC) via a non time critical communications system (e.g. Ethernet). At the bottom of the control chain is the Fieldbus, which links the PLCs to the components which actually do the work such as sensors, actuators, electric motors, console lights, switches, valves and contactors. The Fieldbus is a two wire combined power and data network comprising one or more segments, each of which comprise a trunk with a number of spurs attached thereto. The network provides both power and communications to the field components on the spurs.

The various components of the system communicate with one another using the Fieldbus IEC61158-2 communications protocol, which is a Manchester encoding system. Data telegrams are transmitted either on dedicated communications circuits, or on the same electrical circuits as the power to drive the field instruments. The data telegrams serve to control and to monitor and diagnose the field instruments in use.

The IEC61158-2 Fieldbus communication protocol, along with other similar data systems such as DSL, Ethernet, HART and so on, and those which will eventually replace IEC61158-2 Fieldbus, comprise a set of discrete physical layer limits within which the communications signals, and the hardware which hosts them, must operate. These physical layer limits include aspects of the signalling, including the data shape and timing rules. IEC61158-2 Fieldbus communications allow for retries should a particular data telegram from a device fail as a result of a fault occurring somewhere on the segment. A typical system will be configured such that a particular number of retries will be attempted until a failure status is determined, and communications with a device suspended. The spur upon which the device is supported may also be de energised or isolated until it can be inspected. If a device is configured to send a data telegram once every second, as a part of the routine communications cycle shared with all the other devices on a particular segment, and the system is set up to allow 5 retries, then if a fault which disrupts the data telegrams persists for longer than 5 seconds the communications will cease, causing the loss of the device to the system. Depending on the number of instruments on the segment, and the number of retries, this time period could be longer, or much shorter. If a segment has only one spur, it's device might be prompted for a data telegram once every tenth of a second, in which case a fault persisting for more than half a second will result in a communications failure.

Fieldbus is often used in Intrinsically Safe environments, for example combustible atmospheres, and in particular gas group classification IIC, Hydrogen and Acetylene, and below, for example gas group IIB and IIA, for gas and/or dust. In a typical combined two wire Fieldbus electrical power and communications circuit there is a power supply, an Intrinsic Safety barrier of some kind, a trunk section leading out into the field, and a number of device couplers with separate spurs connected thereto, on which the field instruments are mounted. The trunk and the spurs together form the segment. The Intrinsic Safety barrier divides the circuit into an Intrinsically Safe side and a non-Intrinsically Safe side. The power supply, the PLCs and other systems like physical layer diagnostic modules which measure physical layer attributes of the electrical circuit and the network hardware, and in part the physical software or protocol being used, are located in the non-Intrinsically Safe side of the circuit, usually in a control room. The trunk, the device couplers, the spurs and the field instruments are located in the Intrinsically Safe side, out in the field.

Intrinsic Safety can be achieved in a number of known ways, from simply limiting the power so open or short circuits cannot form combustible arcs, to using active monitoring and isolating systems which allow higher power levels and act to isolate the power supply from open or short circuits to prevent combustible arcs.

In addition, it is also common to use current limiting protection electronics within active device couplers, which act to either fully isolate or limit the current in a particular spur if a short circuit occurs thereon. Current limiting devices like this comprise a series semiconductor element and a current sense/drive circuit. The circuit monitors the current on the spur, and if it reaches a trip level as a result of a short circuit occurring on the spur the semiconductor is switched to limit the current, and to prevent the fault from affecting the rest of the segment. The circuit either works in a rectangular way and goes to a high impedance to limit the current to the trip level itself and holds it there for a particular period of time, or it works in a foldback way and limits the current to a lower level, thereby effectively isolating the spur from the rest of the segment. Such actions obviously prevent any data telegrams being sent from the device on the spur.

Spur short circuits can occur for example when there is an inadvertent cable make, or if a device itself fails to a short circuit state, which could result from electronic component failure or even flooding of the instrument enclosure. The current limiting electronics prevent any such faults from short circuiting the trunk. Short circuits can also occur when a device is disconnected or when errors occur during routine maintenance and calibration, so the current limiting electronics acts as a safeguard and allows for routine work to be carried out on an active spur without the danger of it affecting other parts of the circuit. The current range of two wire IEC61158 Fieldbus spur current limiting protection electronics within active device couplers includes the Segment Protector® and Spur Guard® products. These particular current limiting devices are slightly limited in their operation, because they can only provide protection against a low ohmic DC faults. Therefore, the applicant's co-pending patent application WO2011148127 discloses an improved device which monitors for a much larger number of physical layer faults, and when these are detected applies a deliberate shunt short circuit to the spur. In this way the current limiter is forced into action to handle this contrived "fault", and does not remain inactive.

The kind of faults handled by these current limiting devices by their nature disrupt the data communications on the spur. A short circuit on a spur for example will prevent a data telegram being sent successfully from a device. However, a short duration fault of this kind can actually be handled by a Fieldbus' data telegram retry mechanism, because if it clears before the end of the retry cycle then a data telegram will be sent successfully. The retry mechanism can also accommodate intermittent faults up to a point, provided they do not occur in quick enough succession throughout the duration of the retry mechanism to disrupt every attempt to send a data telegram. However, if the spur protection electronics applied to a spur simply isolates it when any fault is detected, this will obviously prevent any data communications from being successful. This is particular issue with the device in the applicant's co-pending patent application WO2011148127, because it also generates a deliberate short circuit in response to other kinds of possibly non-data disruptive faults, which obviously results in the spur being fully or partially isolated more often, and the data communications prevented.

BRIEF SUMMARY OF THE INVENTION

The present invention involves using an improved mechanism for detecting and dealing with intermittent or continuous faults which would not in fact disrupt data communications, which can be used in particular with a fault protection circuit like that in the applicant's co-pending patent application WO2011148127, but also with any other kind of fault protection device for use on a spur of any kind of two wire combined power and data network system for automation. In particular, the present invention is directed towards preventing certain kinds of intermittent or continuous faults on such a spur which would not necessarily disrupt data communications from leading to an isolation action which would definitely do so.

Therefore, according to a first aspect of the present invention a segment of a two wire combined power and data network system for automation comprises a trunk, a spur mounted thereon and a fault protection device, in which said fault protection device comprises a control means adapted to monitor the current of said spur, and isolation means adapted to fully or partially isolate said spur from said trunk upon receipt of an activation signal from said control means, in which said control means comprises a failure status determination algorithm comprising an intermittent fault count over time step and a fault duration step, in which said intermittent fault count over time step is satisfied if a pre-determined number of separate faults are detected over a first pre-determined time period, in which said fault duration step is satisfied if a fault is detected which persists for longer than a second pre-determined time period, and in which said control means issues said activation signal upon determination of a failure status on said spur which satisfies the intermittent fault count over time step and/or the fault duration step of said algorithm.

Thus, the fault protection device of the segment of the present invention has two advantageous operational features. Firstly, because it only initiates a remedial isolation action if a pre-determined number of intermittent fault events occur within a pre-determined time frame, according to the fault count over time step of the failure status determination algorithm, the device consequently does not initiate a remedial isolation action if fewer than this pre-determined number of intermittent fault events occurs with the pre-determined time frame. This means that the kinds of intermittent spur faults which do not in fact interfere with the data communications are ignored, preventing spur isolation and a cessation of data communications from the device thereon as a consequence. Such faults can be accommodated by the data telegram retry arrangements used in protocols such as IEC61158-2 Fieldbus. For example, if a retry cycle consists of five reties over 2.5 seconds, then a plurality of intermittent short circuit events which occur within a 1.5 second period can be ignored if they would allow at least one half a second period within which the data telegram signals could be sent successfully. The faults are not ignored in the sense that no action is taken, because the current on the faulty spur is still limited to an upper level, rather the mere fact that the current reaches this limit does not initiate an action to isolate the spur.

Therefore, by using the failure status determination algorithm the control means is able to decide the meaning of the detected current within a very short timeframe, and in particular within the duration of the retry mechanism. The control means can then decide what action to take with regard to the spur's connection, and in particular, whether or not to isolate it from its trunk.

Secondly, because the fault protection device only initiates a remedial isolation action if a fault has a duration of a pre-determined length, according to the fault duration step of the failure status determination algorithm, the device consequently does not initiate a remedial isolation action if a fault has a duration of less than this pre-determined length. This means that the kinds of spur faults which are too short to interfere with the data communications are ignored, preventing spur isolation and a cessation of data communications from the device thereon as a consequence. Again, such faults can be accommodated by the data telegram retry arrangements used in protocols such as IEC61158-2 Fieldbus. If a retry mechanism consists of five reties over a 2.5 second period, then a single short circuit event with a duration of less than 1.5 seconds can be ignored, because it would allow at least one half second period at the beginning or the end of the 2.5 second duration of the retry mechanism within which data telegram signals could be sent successfully.

Therefore, the invention allows a device that is correctly functioning to within a specified current range to remain attached if it experiences deviation caused by things like contact clatter or an intermittent connection (for example connections making and breaking with each other, or contact bounce and so on), which with known arrangements would lead to a spur isolation action being performed. One make-break contact may affect many telegrams from a device, but if these occur over a period far longer than the macro cycle, of say one hour, then the communication with the device will continue, and it will not be disconnected or placed on standby (leading to loss of automatic control). However, events which are specifically outside the limits for Fieldbus operation, for example continuous short circuits or power failures, or intermittent faults which persist longer that the retry mechanism takes, will still cause the spur to be isolated, and prevent such faults affecting the other devices on the segment. Intermittent connecting or shorting devices do affect the telegrams of other participating devices on the same segment, so isolation of an ineffectual device is critical in order to preserve automatic operation for the whole segment.

While the invention is defined in terms of a trunk and a spur, it will be appreciated that in practice any trunk will likely have a plurality of spurs, in which case each one can be provided with a fault protection device as described herein, which will all work in concert with one another to protect the segment from faults occurring on any of the spurs. It would of course also be possible to establish the invention in relation to one or only some of the spurs in a segment, but this would be less than optimal.

It will be appreciated that the fault count over time step and the fault duration step of the failure status determination algorithm could be established according to any required rationale, for example a general level of acceptable faultiness or an Intrinsic Safety limit. However, as explained above these steps are preferably established in relation to a data telegram retry mechanism. Therefore, in a preferred embodiment the segment can comprise one or more field devices which send data telegrams, the network system can be configured with a data telegram retry mechanism adapted to retry sending a failed data telegram a pre-determined number of times, and the control means can be configured such that said intermittent fault count over time step of the failure status determination algorithm is satisfied if a pre-determined number of intermittent faults are detected over a first duration which is equal to or less than a length of time it takes to complete said data telegram retry mechanism.

Therefore, the number of intermittent fault events permitted can be a pre-determined number within this period of time it takes to perform the data telegram retry mechanism. It will be appreciated that this length of time will be segment specific, because it will depend on the number of field devices which are connected to the segment, but it will also depend on the number of retries the network system is set up to attempt. This can be set as a few as one retry, or five or more. It has been found that in practice a count of four intermittent fault events within the duration of a retry mechanism may prevent successful data communications, but up to three may not.

In order to contain the fault count within the prescribed time limit, and to prevent a remedial isolation action being performed simply by virtue of the fault count reaching the limit over any time frame, the control means can be configured such that each intermittent fault counted during said intermittent fault count over time step of the failure status determination algorithm counts towards said intermittent fault count for a period equal to said first duration. In other words, the fault count is a rolling fault count over time, and a first duration (which is equal to or less than the duration of the retry mechanism) commences with each intermittent fault detected.

Another way of saying this is that the fault count can be incrementally decreased by one every time a given time period has elapsed. In particular, should a count of three faults remain static for longer than the given time period, the control means can decrease the fault count by one, and then keep doing so until the fault count is reduced to zero.

With regard to the fault duration step of the failure status determination algorithm, this could also be established according to any required rationale, for example a general level of non acceptable faultiness, or a breach of a particular protocol physical layer limit or an Intrinsic Safety limit. For example, a short circuit with a continuous duration of 2 seconds may not be permitted, in which case the fault duration step could be satisfied if a fault is detected with such a duration. However, in a preferred embodiment of the invention the control means can be configured such that said fault duration step of the failure status determination algorithm is satisfied if a fault is detected with a second duration which is equal to or less than a length of time it takes to complete said data telegram retry mechanism. In other words, if a fault were to persist continuously for a length of time which is equal to the length of the retry mechanism, that would cause a complete data communications failure of every device on the segment, so a remedial isolation action to isolate the spur which is being problematic can be performed to at least allow for all the other devices to continue to function. As explained above the second duration can also be less than the duration of the retry mechanism, and in particular it can be a length which is simply sufficient to disrupt data communications with one or more devices on the segment. For example, if the retry mechanism takes 2.5 seconds, a fault of 2 seconds or more could still be sufficient to disrupt all five retries by one or more of the field devices on the segment. As such the second duration in such an example could be set to 2 seconds.

A further advantage is achieved if faults can be ignored for a period of time from a given point, for example the point at which a device is attached to a spur or disconnected therefrom. This is because in the first 20 ms or so after such an event the current on a spur can reach levels apparently indicative of faults. Therefore, preferably the failure status determination algorithm can further comprise a post device attachment or disconnection deadband duration step during which said control means can be configured not to issue said activation signal upon determination of a failure status on said spur which satisfies the intermittent fault count over time step and/or the fault duration step of said algorithm. In order to achieve this the control means must be able to recognise an event as a device connection or disconnection. In order to achieve this the control means can be configured to identify that a spur is inactive if there is a prolonged period of substantially no current, and then to recognise that a particular kind of transition to a normal operating current, or above, constitutes a device connection, and therefore the need to apply the deadband duration step. Likewise, the control means can be configured to recognise that a particular kind of transition from a normal operating current to substantially no current constitutes a device disconnection, and therefore the need to apply the deadband duration step. The powering up and powering down of a spur when a device is connected or disconnected can be discerned as the particular kinds of transitions referred to above, because they have particular discernible characteristics, which the control means can be configured to recognise in any of the known ways.

With regard to the faults which are detected and which contribute to the fault count over time and fault duration steps of the failure status determination algorithm, these can be any kinds of detectable faults which could affect a spur or device of a two wire combined power and data network system for automation, including changes to any measurable physical layer attribute. However, preferably the control means is arranged to monitor the current on the spur, and to discern faults as transitions in the current. Therefore, the control means can be configured such that an intermittent fault is counted in the intermittent fault count over time step of the failure status determination algorithm whenever the control means detects that the current of said spur transitions from any of a no-device attached current range, a normal operating current range or an upper current limit to another of said no-device attached current range, normal operating current range or upper current limit. This is a simple and expedient way to recognise that a spur has either shorted or disconnected, or in particular has an intermittent short or disconnection. The upper current limit can be a current level above which the spur cannot climb by virtue of any known current limiting system being applied thereto, which acts to limit the current whenever it reaches a particular level. Such current limiters are well known, and all spurs of two wire combined power and data network systems for automation are fitted with one.

These three current ranges essentially establish thresholds for the normal operating current level of the spur (the higher "range" simply being anything which is higher than the upper current limit and therefore drives the current on the spur to the upper current limit). Once the current level leaves the normal operating current range and either enters the no-device attached current level, or reaches the upper current limit, these thresholds have been breached. It will be appreciated that what constitutes a normal operating current level, or indeed a no-device attached current level or an upper current limit, can fluctuate over time, and as a result of various possible external influences. Therefore, in an expedient embodiment of the invention the three current ranges may be adaptive over time according to any know rationale. (In addition to this, the control means could also be configured such that the intermittent fault over time step and/or the fault duration step of the failure status determination algorithm are adaptive, so fluctuations in data communications performance of the segment, and in particular the duration of the retry mechanism, which are caused by any external influences can also be accommodated.)

By establishing these three current ranges, it can be seen that there are six possible transitions between them, and as such the control means can be configured to recognise each type, and to react differently, as explained further below.

Suitable ranges for a two wire combined power and data network system for automation could be, for example: no device attached current range: 0-5 mA, normal operating current range: 6-40 mA, upper current limit: 41-50 mA. It will be appreciated that these ranges will depend on the hardware used, its measurement accuracy and the spur power available. In a slight variation the current ranges could have gaps between them to allow them to be cleanly separated and therefore easier to determine. In such an arrangement the ranges could be: no device attached current range: 0-2 mA, normal operating current range: 6-45 mA, upper current limit: >50 mA.

Using these three current ranges it can be seen how the deadband duration step can be performed. In particular, the control means can be configured to determine the attachment of a device when it detects that the current of said spur transitions from said no-device attached current range to said normal operating current range or said upper current limit after a pre-determined no-device attached duration. Furthermore, the control means can be configured to determine the disconnection of a device when it detects that the current of said spur transitions from said normal operating current range to said no-device attached current range. As explained above, the manner of transition, which can be indicative of a device power up or power down can also be used to differentiate these events from actual faults, for example an intermittent disconnection on the spur during powered use.

It will be appreciated that with the above described arrangement of determining transitions between the three current ranges, the control means could be configured to recognise the difference between positive and negative going transitions, and therefore to react differently to them. For example, an intermittent short circuit will involve a positive going transition from the normal operating current range to the upper current limit, followed by a negative going transition back to the normal operating current. The control means could be configured to recognise such a sequence of transitions as a single fault to be counted, rather than two. However, should the current transition positively from the normal operating current range to the upper current limit, then transition negatively therefrom through the normal operating current range down to the no-device attached current range, this sequence of three transitions could be counted as two faults, or alternatively it could breach another step of the failure status determination algorithm altogether which could dictate an immediate isolation of the spur.

Following on from this, the control means could also be configured such that the fault duration step of the failure status determination algorithm applies differently to faults of particular durations which follow others, and which are recognisable using the current transition arrangement described above. For example, a transition from the upper current limit after a predetermined fault duration time period at that level, down to the no-device attached current range for another predetermined fault duration time period, may be treated differently to the occurrence of a transition from the normal operating current level down to the no-device attached current range for a predetermined fault duration time period. The first event may lead to isolation of the spur indefinitely, while the second event may lead to isolation of the spur for a specified shorter period.

Furthermore, the duration of a fault which satisfies the fault duration step of the failure status determination algorithm can be different according to the nature of the detected current transition, or the nature of the sequence of current transitions which preceded it. In other words, the fault duration step of the failure status determination algorithm can comprise a number of sub-steps which establish the duration length for each kind of fault, or sequence of faults, which can be detected. The satisfying of each of these different sub-steps can then lead to different actions being taken, from none, to various different kinds of remedial isolation, which could be full or partial, and which could have different set durations.

It will be appreciated therefore that the control means could be configured in a large number of different ways to react to all kinds of separately discernible current transitions, or transition sequences. However, of most relevance to the present invention is the ability to discern the difference between on the one hand intermittent or short duration faults which will not affect the data communications on the segment (or rather are considered not likely to do so), and on the other hand those which are more serious and should involve the isolation of the spur from the rest of the segment, either indefinitely or for a pre-determined time period. In other words, as its name suggests, the algorithm of the invention is employed to determine the failure status one way or the other of the spur. It will be up to the skilled person to configure the control means to best suit the spur to which it is applied.

Therefore, in accordance with the claims as set out below, the following three paragraphs define the various features explained above.

The control means can be configured to issue a first kind of activation signal to said isolation means when transitions of a first kind between any of said no-device attached current range, normal operating current range or upper current limit satisfy said intermittent fault count over time step of the failure status determination algorithm, and to issue any number of different second kinds of activation signals to said isolation means when transitions of any number of second kinds between any of said no-device attached current range, normal operating current range and upper current limit satisfy said intermittent fault count over time step of the failure status determination algorithm. The isolation means can be adapted to perform a first kind of isolation action when in receipt of said first activation signal, and to perform any number of different second kinds of isolation actions when in receipt of any of said second activation signals.

The control means can also be configured such that an intermittent fault is counted in the intermittent fault count over time step of the failure status determination algorithm whenever the control means detects that the current of said spur transitions positively from said no-device attached current range or normal operating current range, and/or whenever the control means detected that the current of said spur transitions negatively from said normal operating current range or upper current limit.

The control means can also be configured to issue a third kind of activation signal to said isolation means when a transition of a third kind between any of said no-device attached current range, normal operating current range or upper current limit satisfy the fault duration step of the failure status determination algorithm, and to issue any number of different fourth kinds of activation signals to said isolation means when transitions of any number of fourth kinds between any of said no-device attached current range, normal operating current range and upper current limit satisfy said fault duration step of the failure status determination algorithm. The isolation means can be adapted to perform a third kind of isolation action when in receipt of said third activation signal, and to perform any number of different fourth kinds of isolation actions when in receipt of any of said fourth activation signals.

These first to fourth kinds of transitions, signals and isolation actions can be configured by the skilled person to suit the spur and segment in question, as explained in more detail above. What is important is that the control means can be configured to differentiate between different kinds of faults which can satisfy either the intermittent fault over time step or the fault duration step of the failure status determination algorithm, and to control the isolation means in different ways accordingly.

In a slightly different arrangement to that described above, the control means can be configured such that an intermittent fault is counted in the intermittent fault count over time step of the failure status determination algorithm whenever the control means detects that the current of said spur exceeds a low level current limit and/or a high level current limit. Therefore, rather than using the three current ranges as described above, in this version of the invention there is a simpler low and high level current limits.

In terms of the kinds of isolation action performed, these can be any of the known kinds. For example, it can comprise a series and/or shunt low impedance connecting switch, or a high impedance isolating switch, depending on any given defined set of requirements. In one version of the invention the isolation means can be that defined in the applicant's co-patent application WO2011148127, which is described above.

Therefore, in one version of the invention the isolation means can comprise a switching device which fully isolates said spur upon receipt of an activation signal from said control means by going open circuit. As an alternative, or the isolation means can comprise a current limiting device which partially isolates said spur upon receipt of an activation signal from said control means by transitioning from a normal current limit to a lower current limit.

It will be appreciated that the above described fault protection device could be provided as a part of a segment during installation, but it could also be applied to an existing segment of a two wire combined power and data network system for automation. Therefore, according to a second aspect of the present invention there is provided a fault protection device for use in creating a segment of a two wire combined power and data network system for automation as claimed in any of the claims as set out below, in which said fault protection device comprises a control means adapted to monitor the current of a spur of said segment with which it is used, and isolation means adapted to fully or partially isolate said spur from a trunk of said segment upon receipt of an activation signal from said control means, in which said control means comprises a failure status determination algorithm comprising an intermittent fault count over time step and a fault duration step, in which said intermittent fault count over time step is satisfied if a pre-determined number of separate faults are detected over a first pre-determined time period, in which said fault duration step is satisfied if a fault is detected which persists for longer than a second pre-determined time period, and in which said control means issues said activation signal upon determination of a failure status on said spur which satisfies the intermittent fault count over time step and/or the fault duration step of said algorithm.

Furthermore, the invention also includes a method of using such a fault protection device. Therefore, according to a third aspect of the present invention a method of using a fault protection device as claimed in claim 14 below, comprises the following steps:

Mounting said fault protection device between a trunk and a spur of a segment with which it is to be used; and Operating said fault protection device to monitor the current of said spur, and to fully or partially isolate said spur from said trunk if the intermittent fault count over time step and/or the fault duration step of said algorithm are satisfied.

BRIEF DESCRIPTION OF THE DRAWINGS

The invention can be performed in various ways, but one embodiment will now be described by way of example, and with reference to the accompanying drawings, in which.

DETAILED DESCRIPTION

Figure 1:
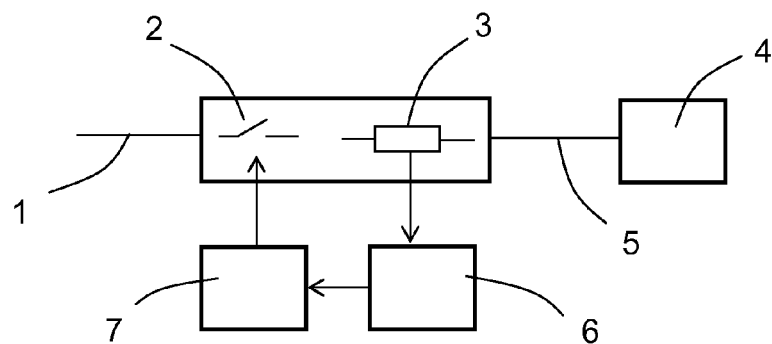
FIG. 1 is a diagrammatic view of a segment of a two wire combined power and data network system for automation according to the first aspect of the present invention.
Figure 3:
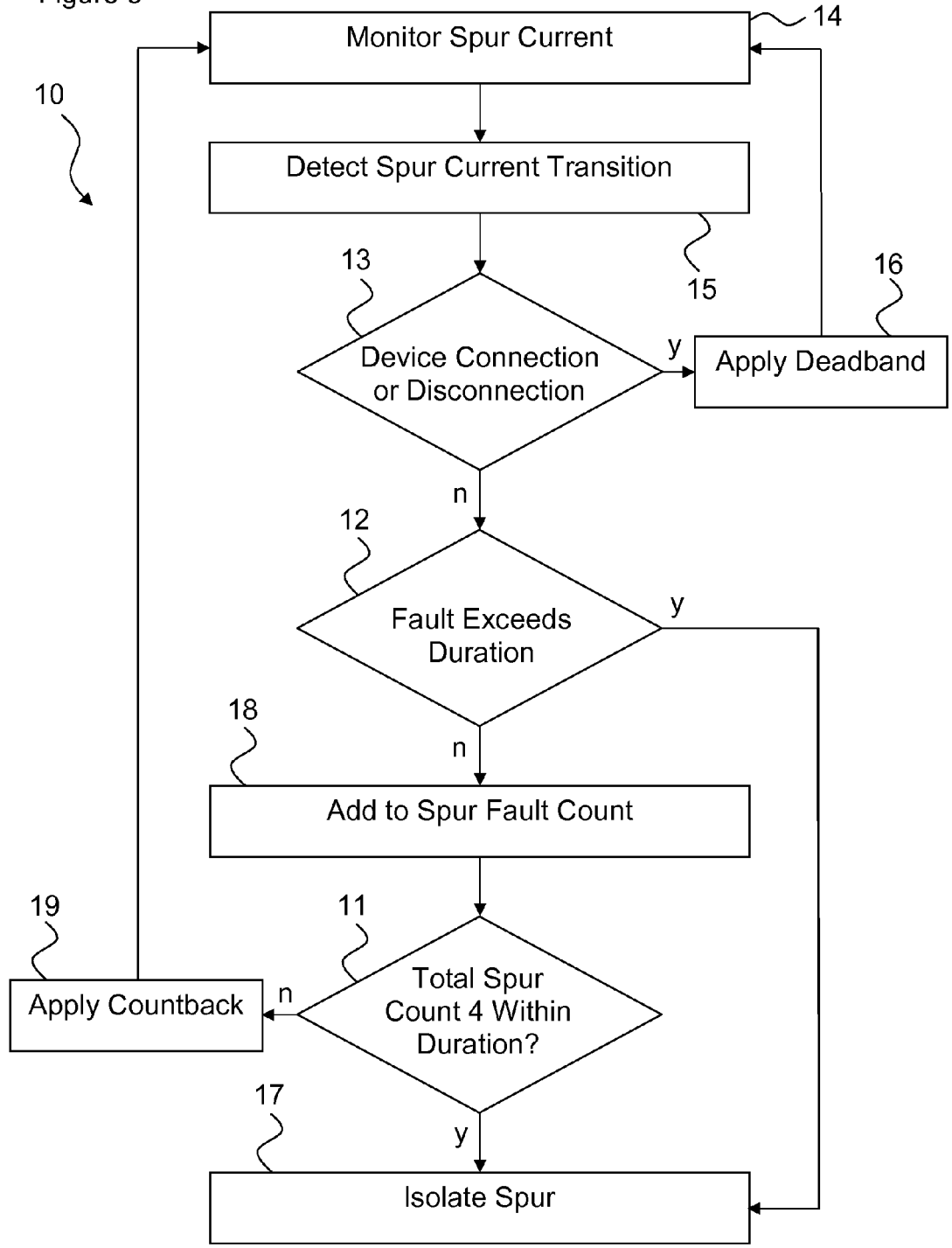
FIG. 3 is a failure status determination algorithm as used by the fault protection device as shown in FIG. 1; and, FIG. 4 is the failure status determination algorithm as shown in FIG. 3 in a different arrangement.

As shown in FIGS. 1 and 3, a segment of a two wire combined power and data network system for automation comprises a trunk 1, a spur 5 mounted thereon and a fault protection device 3, 6, 7, 2. The fault protection device comprises a control means 3, 6, 7, adapted to monitor the current of said spur 5, and isolation means 2 adapted to fully or partially isolate said spur 5 from said trunk 1 upon receipt of an activation signal from said control means 7. The control means 7 comprises a failure status determination algorithm 10 comprising an intermittent fault count over time step 11 and a fault duration step 12. As explained further below, the intermittent fault count over time step 11 is satisfied if a pre-determined number of separate faults are detected over a first pre-determined time period, and the fault duration step is satisfied if a fault is detected which persists for longer than a second pre-determined time period. The control means 7 issues said activation signal upon determination of a failure status on said spur 5 which satisfies the intermittent fault count over time step 11 and/or the fault duration step 12 of said algorithm 10.

Figure 4:
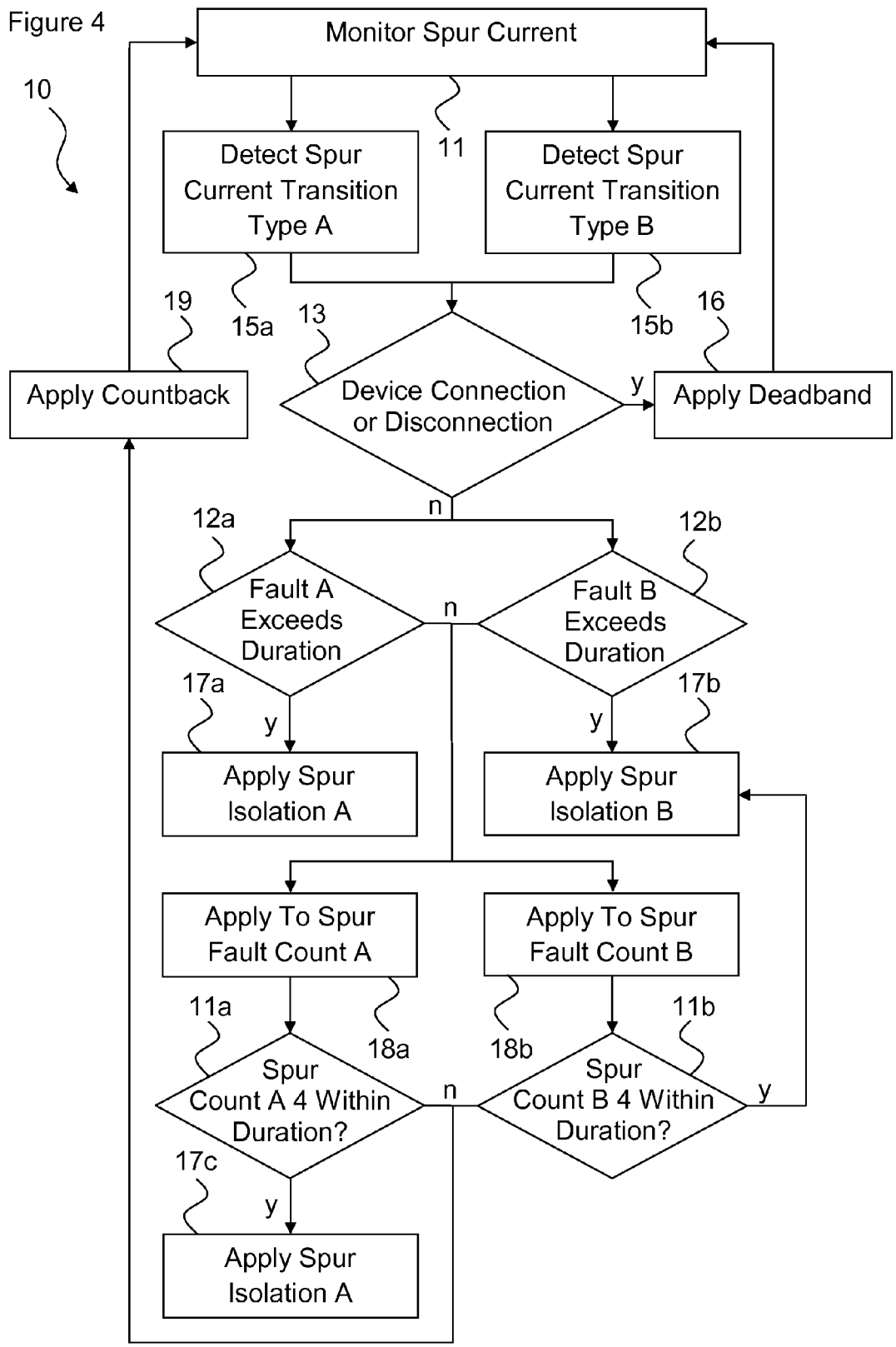

FIG. 1 illustrates in a very basic way a segment according to the invention. In particular, it only shows the one spur 5 attached to the trunk 1, where in practice there would be a plurality of such spurs, each provided with the same fault protection arrangement. Therefore, FIG. 1 really only shows the essential features of the invention, for illustrative purposes. There are other spurs (not shown) on the trunk 1 in this example, and they are further described below. The current of the spur 5 is monitored at 3 using a static and/or dynamic analogue current measuring component 6. The output of this component is then fed to a computer processor 7 which is provided with a computer program comprising the failure status determination algorithm 10 as shown in FIGS. 3 and 4. The output is subjected to the failure status determination algorithm 10, and if this is satisfied the processor 7 sends an activation signal to the switch 2, which goes open circuit to isolate the spur 5 from the trunk 1 of the segment. The processor 7 incorporates a current limiting mechanism of the known kind which prevents the current on the spur 5 from ever exceeding 50 mA. Such mechanisms are widely known, and serve to prevent the current on spurs from reaching critical levels.

In this illustrative example the network is an IEC61158 Fieldbus segment, and a field device 4 is mounted on the spur 5. Also attached to the trunk 1 are four other similar spurs (not shown), each with their own field device, and an identical fault protection arrangement. The network host (not shown) performs a communications cycle in which each device 4 is poled for a data telegram once every half second. If one of these data telegrams fails then the devices are set up to make five retries, which will take 2.5 seconds, or slightly less. It will be appreciated that these timings are specific to the segment arrangement being described, and in practice more or fewer devices could be present on a segment, and the time between requests from the host could be longer or far less. The length of the data telegrams in question will also have an impact on the duration of the communications cycle. In addition, the number of retries could be less, even as few as one retry. Therefore, the time period within which a fault could cause a communications failure could be in the milliseconds region. The engineer who sets up the spur 5 will program the processor 7 accordingly, so that the first duration, which must be equal to or less than the length of time it takes to complete the data telegram retry mechanism, is set appropriately according to all these contributing factors.

FIG. 3 shows the failure status determination algorithm 10 used by the processor 7. As explained further below, this algorithm 10 comprises an intermittent fault over time step 11 and a fault duration step 12. It also comprises a post device attachment or disconnection deadband duration step 13.

Therefore, the algorithm 10 makes the computer processor 7 function as follows. As an initial step 14, the current on the spur 5 fed to the computer processor 7 from the current measuring component 6 is monitored. At a second step 15 the processor 7 detects a transition in the current on the spur 5. In this example the processor 7 is programmed to recognise transitions in the spur current between a no device attached current range of 0-2 mA, a normal operating current range of 6-45 mA, and an upper current limit of >50 mA. The detected transition can be from any one of these ranges to either of the others. The upper current limit is effectively defined by the current limiting mechanism incorporated into the processor 7, which limits the current on the spur 5 at 50 mA in any event. As such, the current on the spur 5 will never go above 50 mA, however while a fault exists which drives the current into the limit, the current on the spur 5 is treated as being at the upper current limit.

Next, the computer processor 7 determines if the detected transition is as a result of a device connection or disconnection, at step 13. It does this in any of the known ways by recognising characteristics of the detected transition which are indicative of a device powering up or down, or which occur after a prolonged period of low current. If the computer processor 7 determines that the detected transition in the spur current is as a result of a device connection or disconnection it applies a deadband period at step 16, during which any detected transitions in the spur current are ignored. The deadband period in this example is 20 ms, as in this time a short circuit can be expected as part of normal device start-up, for example.

If the computer processor 7 determines that the detected transition in the spur current is not as the result of a device connection or disconnection, it then moves to the fault duration step 12. Here the duration of the fault is measured, and in this example this step 12 is satisfied if the fault exceeds 2 seconds in length. This is because a fault of that duration or longer could be sufficient to disrupt all five attempts from a device on the segment in a five try communications cycle of 2.5 seconds. If this is so the computer processor 7 issues an activation signal to the switch 2 at step 17, and the spur 5 is isolated from the trunk 1, with the device 4 thereon being de-energised. It will be appreciated that this step 12 also involves determining that the detected transition in the spur current relates to a fault, and in particular is a transition to the no-device attached current range or the upper current limit. A transition from one of these ranges to the normal operating current range would not be a fault, but a return to normal.

If the detected transition in the spur current is of insufficient duration to satisfy step 12, because the detected transition of the spur current to the no-device attached current range or the upper current limit is then followed within 2 seconds by a further transition in the spur current back to the normal operating range, then the computer processor 7 move to step 18. Here the computer processor 7 adds a single count to a spur fault count it maintains in its memory. The computer processor 7 then moves to the intermittent fault count over time step 11, where it determines if the spur fault count it maintains has reached a total of 4. If this is so the computer processor 7 issues an activation signal to the switch 2 at step 17, and the spur 5 is isolated from the trunk 1. If however the spur fault count is less than 4 the computer processor returns to monitor the spur current at initial step 14. It will be appreciated that in practice the initial step 14 will be continuous, and the processor 7 will operate the algorithm 10 continuously, rather than in a looped way. Once a count has been added to the spur fault count a countback is added at step 19. This involves the count which has been added to the spur fault count being removed therefrom after 2.5 seconds. This means that in order to reach a spur fault count total of 4, 4 faults must be detected within a period 2.5 seconds from the earliest counted fault. As such, in order for the intermittent fault count over time step 11 to be satisfied, there has to be an intermittent fault of sufficient frequency to disrupt the data communications on the spur 5. Crucially, if the intermittent fault does not reach this frequency then step 17 will not be reached from step 11. In other words, an intermittent fault which would not affect the data communications on the spur 5, nor the rest of the segment, by virtue of the five retries each device on the segment it is set up to make, will not lead to spur isolation.

Figure 2:
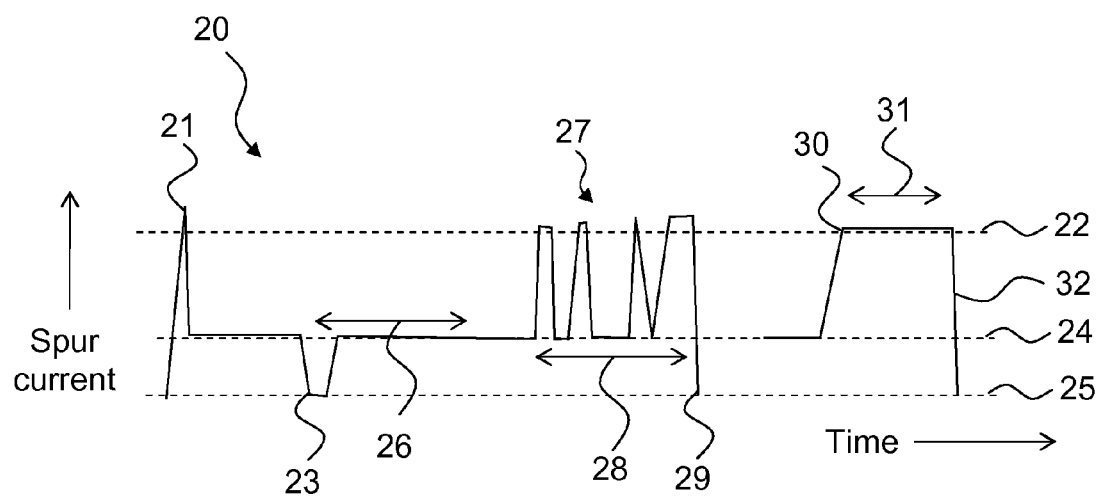
FIG. 2 is a graph which illustrates various faults which are dealt with by the fault protection device as shown in FIG. 1.

FIG. 2 is a graph 20 which demonstrates a number of the kind of current transitions on the spur 5 which would be handled by the algorithm 10 in the manner described above. In particular, at the beginning of the time line a device is connected to the spur 5 and there is a current spike at 21 up to the imposed current limit, indicated by hashed line 22. However, this apparent short circuit is ignored because it is determined by the processor 7 at the device connection or disconnection step 13 that a device has been connected, and as such the deadband of 20 ms is applied at step 16.

Next, the current on the spur 5 transitions at 23 from a normal device current level, indicated by hashed line 24, down to zero, indicated by hashed line 25. In this example no action is taken because this fault is of insufficient duration to satisfy the fault duration step 12, and because although the fault therefore does contribute to the fault count at step 18, the fault count has not reached a total of 4, so the intermittent fault count over time step 11 is not satisfied. In addition, as the current on the spur 5 then returns to the normal device current level 24 for more than 2.5 seconds, as indicated by time axis arrow 26, the fault count which has been made is deleted at step 19, reducing the running fault count back to zero. It will therefore be appreciated that the fault 23 does not lead to an isolation of the spur 5, and the data communications thereon will continue by virtue of a successful retry.

Next, the current on the spur 5 transitions at 27 from the normal device current level 24 up to the current limit 22 and back down again four times in quick succession. In each case the fault is of insufficient duration to satisfy the fault duration step 12, and as such each one is counted at step 18 towards the spur fault count maintained by the processor 7. In the first three instances the following step 11 is not satisfied because the total spur fault count has not reached 4. Although the 2.5 second countback is applied to each count at step 19, the fourth fault occurs within 2.5 seconds of the first, as indicated by time axis arrow 28 in FIG. 2, and as such when this fourth fault is added to the fault count at step 18, it is determined at the following step 11 that the total spur fault count is now 4. As such, the processor 7 sends an activation signal to the switch 2 at step 17, and the spur 5 is isolated. As shown in FIG. 2, the current on the spur 5 drops at 29 to zero 25.

FIG. 2 also shows the occurrence of another fault where the current on the spur 5 transitions from the normal device current level 24 up to the current limit 22 at 30, because of a short circuit. On this occasion the fault persists for more than 2 seconds, as indicated by time axis arrow 31. As such, the fault duration step 12 of the algorithm 10 is satisfied, and the processor 7 sends an activation signal to the switch 2 at step 17, and the spur 5 is isolated. As shown in FIG. 2, the current on the spur 5 drops at 32 to zero 25.

The algorithm 10 can also be adapted to accommodate different reactions to different kinds of faults. The degree of possible adjustability is large, but FIG. 4 shows a basic example in order to demonstrate the principal at work, and in particular to show how the algorithm 10 might be used to deal with two different types of detected fault. In FIG. 4 the same reference numbers have been used for each of the steps which are equivalent to those shown in FIG. 3.

With the algorithm 10 set up in this way, the computer processor 7 can detect fault type a at step 15a, and fault type b at step 15b. The fault type a in this illustrative example is a transition from the no device attached current range or the normal operating current range to the upper current limit, for example in the manner shown at 27 and 30 in FIG. 2, which would be indicative of a short circuit. The fault type b is a transition from the normal operating current range or the upper current limit, to the no-device attached current range, for example in the manner shown at 23 in FIG. 2, which would be indicative of a cable disconnection fault. The algorithm 10 deals with these detected faults in the same way as explained above in relation to the algorithm 10 as shown in FIG. 3, except that with each kind of fault, a and b, if steps 12a or 12b, or 11a or 11b are satisfied a different kind of isolation action is performed at step 17 a-c. FIG. 1 only illustrates a very simplistic isolation switch 2, but it will be appreciated that there are many different ways a spur can be fully or partially isolated. For example it could be entirely isolated by going open circuit, or a lower current limit can be applied to only partially isolate the spur. In addition, the full or partial isolation can be indefinite or for a predetermined period only. Furthermore, the isolation can be removed incrementally at a given time afterwards in order to probe for faults in any of the known ways. Therefore, if fault a is a short circuit, then step 17a can involve a full isolation of the spur indefinitely. However, if fault b is a cable disconnection then step 17 can involve the spur being partially isolated by having the current limit lowered for a period of 5 seconds. Furthermore, step 17c can involve full isolation of the spur for 30 seconds rather than indefinitely, so that an intermittent fault which satisfied step 11a can be allowed to clear. Whereas, FIG. 4 shows step 11b leading to step 17b, simply to demonstrate that the same or different remedial actions can be applied from the fault duration steps 12a and 12b or the intermittent fault count over time steps 11a and 11b.

It will be appreciated that what is shown in FIG. 4 is for illustrative purposes, and that the manner in which the algorithm 10 is programmed into the processor 7 will be up to the engineer who fits the spur 5. What is important is the basic functionality of the algorithm 10, and in particular its ability to discern a difference between faults which will affect the particular data communications on the segment in question, and those which will not. In addition, it also has the inherent ability to be set up to deal with different kinds of faults which do affect the communications on the segment differently depending on their nature. How the algorithm 10 is precisely calibrated to achieve these ends in a specific instance will depend on the physical layer attributes of the segment in question, and the requirements considered necessary.

It will be appreciated that other algorithms can be operated in conjunction with algorithm 10 to provide enhanced capabilities. For example, some sequences of current transitions which do not satisfy the algorithm 10, for example in the manner of fault 23 shown in FIG. 2, could still be considered faults worthy of a remedial isolation action, according to a separate rationale. For example, a predetermined period of normal operating current level followed by a current transition to zero for a predetermined period (which was shorter than 2 seconds in this example) could be identified as a fault and remedial action taken. This is what happens at 23 in FIG. 2, and it could be indicative of a device failure. The application of such a rationale could be applied using a separate algorithm, or it could be incorporated into an algorithm like 10, for example by having separate durations considered at step 12, which were applied according to the duration of a normal operating current level being seen prior to the transition to zero. In another example, the algorithm 10, or one associated with it, could react when there is detected a spur power consumption of normal device level or higher for at least 1.3 ms, followed by a power consumption of no device attached for at least 1.3 ms. The spur could be turned off in this instance. This algorithm helps to detects low frequency short circuit events It will be appreciated that the manner in which separate or interdependent algorithms are programmed into a computer could involve a degree of overlap and complexity which is not demonstrated by FIGS. 3 and 4. However, it would be within the competency of a software engineer to program a computer to perform in the manner described here, and all that is essential to perform the invention is for the functionality described to be provided using the illustrated algorithm.

As will be appreciated from the above, the device of the invention can deal with multiple coming/going short circuits in fast succession, open cable ends, or no device connected to the spur (e.g. as happens when exchanging a device while the cable is still connected to the spur output of a segment protector). It can also deal with multiple fast events of connecting/disconnecting a device (e.g. as happens when a device is connected through a broken cable). In addition, short circuits on a cable where a device is attached (i.e. when a device cable end is not open; e.g. a crimped cable) can also be detected, although that depends on the power consumption of a field device and its start-up behaviour.

The second aspect of the present invention covers a fault protection device for use in creating a segment like that described above. FIGS. 1, 3 and 4 provide support for this aspect of the present invention, because they show such a fault protection device, and the algorithm with which it is provided.

The third aspect of the present invention covers a method of using a fault protection device as described above, and once again FIGS. 1, 3 and 4 and the accompanying description provide support for this method, because they show the manner of use of such a fault protection device.

Therefore, the present invention provides a device which can discern the difference between faults which would affect the data communications on a segment of a two wire combined power and data network system for automation, and those which would not. This allows the system to permit faults which would not affect the communications, and only react to those which would. The advantages of such a system are that data communications would be lost on fewer occasions, leading to greater operational efficiency of a network, and fewer causes for remedial work.

The invention claimed is:

1. A segment of a two wire combined power and data network system for automation comprising a trunk, a spur mounted thereon and a fault protection device, in which said fault protection device comprises:
a current measurement component for monitoring the current of said spur, a computer processor which is provided with a computer program comprising a failure status determination algorithm, and an
isolation mechanism for fully or partially isolating said spur from said trunk upon receipt of an activation signal from said computer processor;
in which an output of said current measurement component is fed to said computer processor;
in which when said computer program is run on said computer processor said computer processor subjects said output to an intermittent fault count over time step and a fault duration step of said algorithm;
in which said computer processor satisfies said intermittent fault count over time step if it detects a pre-determined number of separate faults over a first pre-determined time period occurring on said output
in which said computer processor satisfies said fault duration step if it detects a fault which persists for longer than a second pre-determined time period occurring on said output;
in which said computer processor is arranged to issue said activation signal upon determination of a failure status on said spur when said computer processor satisfies the intermittent fault count over time step and/or the fault duration step of said algorithm; and
in which said computer processor is configured such that it counts an intermittent fault in the intermittent fault count over time step whenever it detects that the current of said spur transitions from any of a no-device attached current range, a normal operating current range or an upper current limit to another of said no-device attached current range, normal operating current range or upper current limit.

2. The segment of a two wire combined power and data network system for automation as claimed in claim 1 in which said segment comprises one or more field devices which send data telegrams, in which said network system is configured with a data telegram retry mechanism adapted to retry sending a failed data telegram a pre-determined number of times, and in which said computer processor satisfies said intermittent fault count over time step of the failure status determination algorithm if it detects a pre-determined number of intermittent faults over a first duration which is equal to or less than a length of time it takes to complete said data telegram retry mechanism.

3. The segment of a two wire combined power and data network system for automation as claimed in claim 2 in which each intermittent fault counted by said computer processor during said intermittent fault count over time step of the failure status determination algorithm counts towards said intermittent fault count for a period equal to said first duration.

4. The segment of a two wire combined power and data network system for automation as claimed in claim 1 in which said segment comprises one or more field devices which send data telegrams, in which said network system is configured with a data telegram retry mechanism adapted to retry sending a failed data telegram a pre-determined number of times, and in which said computer processor satisfies said fault duration step of the failure status determination algorithm if it detects a fault with a second duration which is equal to or less than a length of time it takes to complete said data telegram retry mechanism.

5. The segment of a two wire combined power and data network system for automation as claimed in claim 1 in which said failure status determination algorithm further comprises a disconnection deadband duration step during which said computer processor is configured not to issue said activation signal upon determination of a failure status on said spur which satisfies the intermittent fault count over time step and/or the fault duration step of said algorithm.

6. The segment of a two wire combined power and data network system for automation as claimed in claim 1 in which said failure status determination algorithm further comprises a disconnection deadband duration step during which said computer processor is configured not to issue said activation signal upon determination of a failure status on said spur which satisfies the intermittent fault count over time step and/or the fault duration step of said algorithm, in which said computer processor is configured to determine the attachment of a device when it detects that the current of said spur transitions from said no-device attached current range to said normal operating current range or said upper current limit after a pre-determined no-device attached duration, and in which said computer processor is configured to determine the disconnection of a device when it detects that the current of said spur transitions from said normal operating current range to said no-device attached current range.

7. The segment of a two wire combined power and data network system for automation as claimed in claim 1 in which said computer processor is configured to issue a first kind of activation signal to said isolation mechanism when it detects transitions of a first kind between any of said no-device attached current range, normal operating current range or upper current limit which satisfy said intermittent fault count over time step of the failure status determination algorithm, and to issue any number of different second kinds of activation signals to said isolation mechanism when it detects transitions of any number of second kinds between any of said no-device attached current range, normal operating current range and upper current limit which satisfy said intermittent fault count over time step of the failure status determination algorithm, and in which said isolation mechanism is adapted to perform a first kind of isolation action when in receipt of said first activation signal, and to perform any number of different second kinds of isolation actions when in receipt of any of said second activation signals.

8. The segment of a two wire combined power and data network system for automation as claimed in claim 1 in which said computer processor is configured such that it counts an intermittent fault in the intermittent fault count over time step of the failure status determination algorithm whenever said computer processor detects that the current of said spur transitions positively from said no-device attached current range or normal operating current range, and/or whenever said computer processor detects that the current of said spur transitions negatively from said normal operating current range or upper current limit.

9. The segment of a two wire combined power and data network system for automation as claimed in claim 1 in which said computer is configured to issue a third kind of activation signal to said isolation mechanism when it detects a transition of a third kind between any of said no-device attached current range, normal operating current range or upper current limit which satisfy the fault duration step of the failure status determination algorithm, and to issue any number of different fourth kinds of activation signals to said isolation mechanism when it detects transitions of any number of fourth kinds between any of said no-device attached current range, normal operating current range and upper current limit which satisfy said fault duration step of the failure status determination algorithm, and in which said isolation mechanism is adapted to perform a third kind of isolation action when in receipt of said third activation signal, and to perform any number of different fourth kinds of isolation actions when in receipt of any of said fourth activation signals.

10. The segment of a two wire combined power and data network system for automation as claimed in claim 1 in which said computer processor is configured such that it counts an intermittent fault in the intermittent fault count over time step of the failure status determination algorithm whenever said computer processor detects that the current of said spur exceeds a low level current limit and/or a high level current limit.

11. The segment of a two wire combined power and data network system for automation as claimed in claim 1 in which said isolation mechanism comprises a switching device which fully isolates said spur upon receipt of an activation signal from said computer processor by going open circuit.

12. The segment of a two wire combined power and data network system for automation as claimed in claim 1 in which said isolation mechanism comprises a current limiting device which partially isolates said spur upon receipt of an activation signal from said computer processor by transitioning from a normal current limit to a lower current limit.

13. A fault protection device for use in creating the segment of a two wire combined power and data network system for automation of claim 1, in which said fault protection device comprises a current measurement component for monitoring the current of a spur of said segment with which it is used, a computer processor which is provided with a computer program comprising a failure status determination algorithm, and an isolation mechanism for fully or partially isolating said spur from a trunk of said segment upon receipt of an activation signal from said computer processor, in which an output of said current measurement component is fed to said computer processor; in which when said computer program is run on said computer processor said computer processor subjects said output to an intermittent fault count over time step and a fault duration step of said algorithm, in which said computer processor satisfies said intermittent fault count over time step if it detects a pre-determined number of separate faults over a first pre-determined time period occurring on said output, in which said computer processor satisfies said fault duration step if it detects a fault which persists for longer than a second pre-determined time period occurring on said output; in which said computer processor is arranged to issue said activation signal upon determination of a failure status on said spur when said computer processor satisfies the intermittent fault count over time step and/or the fault duration step of said algorithm; and in which said computer processor is configured such that it counts an intermittent fault in the intermittent fault count over time step whenever it detects that the current of said spur transitions from any of a no-device attached current range, a normal operating current range or an upper current limit to another of said no-device attached current range, normal operating current range or upper current limit.

14. A method of using a fault protection device as claimed in claim 13, comprising the following steps:
mounting said fault protection device between a trunk and a spur of a segment with which it is to be used; and
operating said fault protection device to monitor the current of said spur, and to fully or partially isolate said spur from said trunk if the intermittent fault count over time step and/or the fault duration step of said algorithm are satisfied.

15. A method of using a fault protection device on a segment of a two wire combined power and data network system for automation comprising a trunk and a spur mounted thereon, the method comprises:
monitoring the current of the spur with a current measurement component;

providing a computer processor, and an isolation mechanism for fully or partially isolating said spur from said trunk upon receipt of an activation signal from said computer processor;

providing said computer processor with a computer program which comprises a failure status determination algorithm comprising an intermittent fault count over time step and a fault duration step;

feeding an output of said current measurement component to said computer processor;

satisfying said intermittent fault count over time step if a pre-determined number of separate faults are detected over a first pre-determined time period;

satisfying said fault duration step if a fault is detected which persists for longer than a second pre-determined time period; and issuing the activation signal from said computer processor upon determination of a failure status on said spur which satisfies the intermittent fault count over time step and/or the fault duration step of said algorithm, wherein said computer processor is configured such that an intermittent fault is counted in the intermittent fault count over time step of the failure status determination algorithm whenever the control means detects that the current of said spur transitions from any of a no-device attached current range, a normal operating current range or an upper current limit to another of said no-device attached current range, normal operating current range or upper current limit.

16. The segment of a two wire combined power and data network system for automation as claimed in claim 1 in which said failure status determination algorithm further comprises a post device attachment step during which said computer processor is configured not to issue said activation signal upon determination of a failure status on said spur which satisfies the intermittent fault count over time step and/or the fault duration step of said algorithm.

17. The segment of a two wire combined power and data network system for automation as claimed in claim 1 in which said failure status determination algorithm further comprises a post device attachment step during which said computer processor is configured not to issue said activation signal upon determination of a failure status on said spur which satisfies the intermittent fault count over time step and/or the fault duration step of said algorithm, in which said computer processor is configured to determine the attachment of a device when it detects that the current of said spur transitions from said no-device attached current range to said normal operating current range or said upper current limit after a predetermined no-device attached duration, and in which said computer processor is configured to determine the disconnection of a device when it detects that the current of said spur transitions from said normal operating current range to said no-device attached current range.

* * * * *